US008929053B2

(12) United States Patent
Morong

(10) Patent No.: US 8,929,053 B2
(45) Date of Patent: Jan. 6, 2015

(54) DIRECT-CURRENT CURRENT TRANSFORMER

(76) Inventor: William Henry Morong, Paoli, PA (US)

( * ) Notice: Subject to any disclaimer, the term of this patent is extended or adjusted under 35 U.S.C. 154(b) by 426 days.

(21) Appl. No.: 13/136,299

(22) Filed: Jul. 28, 2011

(65) Prior Publication Data

US 2012/0063055 A1 Mar. 15, 2012

Related U.S. Application Data

(60) Provisional application No. 61/403,297, filed on Sep. 13, 2010.

(51) Int. Cl.
*H01H 9/28* (2006.01)
*H01F 38/32* (2006.01)
*G01R 15/18* (2006.01)

(52) U.S. Cl.
CPC ............... *H01F 38/32* (2013.01); *G01R 15/18* (2013.01)
USPC ................................ 361/268; 361/32; 361/35

(58) Field of Classification Search
CPC .................... H01F 30/00; H01F 38/32
See application file for complete search history.

(56) References Cited

U.S. PATENT DOCUMENTS

| 3,733,537 | A | * | 5/1973 | Kernick et al. ............ 363/56.07 |
| 4,066,916 | A | * | 1/1978 | King et al. ................... 327/478 |
| 4,210,947 | A | * | 7/1980 | Koizumi ....................... 361/18 |
| 4,907,116 | A | * | 3/1990 | Aschwanden et al. ......... 361/18 |
| 4,947,311 | A | * | 8/1990 | Peterson ....................... 363/124 |
| 5,329,440 | A | | 7/1994 | Chaussy et al. |
| 6,028,422 | A | * | 2/2000 | Preusse ......................... 323/357 |
| 6,724,607 | B2 | * | 4/2004 | Hayashi et al. ............... 361/171 |
| 6,771,518 | B2 | * | 8/2004 | Orr et al. ........................ 363/16 |
| 7,071,678 | B2 | * | 7/2006 | Karlsson et al. ........... 324/117 R |
| 2003/0076086 | A1 | | 4/2003 | Takeda et al. |
| 2004/0145273 | A1 | * | 7/2004 | Khoury et al. ........... 310/316.03 |
| 2007/0133239 | A1 | | 6/2007 | Tanaka |

FOREIGN PATENT DOCUMENTS

| DE | 3041196 A1 | 6/1982 |
| DE | 3422252 A1 | 11/1988 |
| WO | WO 93/23915 A1 | 11/1993 |

* cited by examiner

*Primary Examiner* — Jared Fureman
*Assistant Examiner* — Terrence Willoughby

(57) ABSTRACT

The present invention provides a direct-current current transformer, or DCCT, yielding bandwidth from DC to several MHz. The DCCT according to this invention is a simple, open-loop, device in which flux densities occur at very low levels, avoiding difficulties occasioned by core saturation.

9 Claims, 1 Drawing Sheet

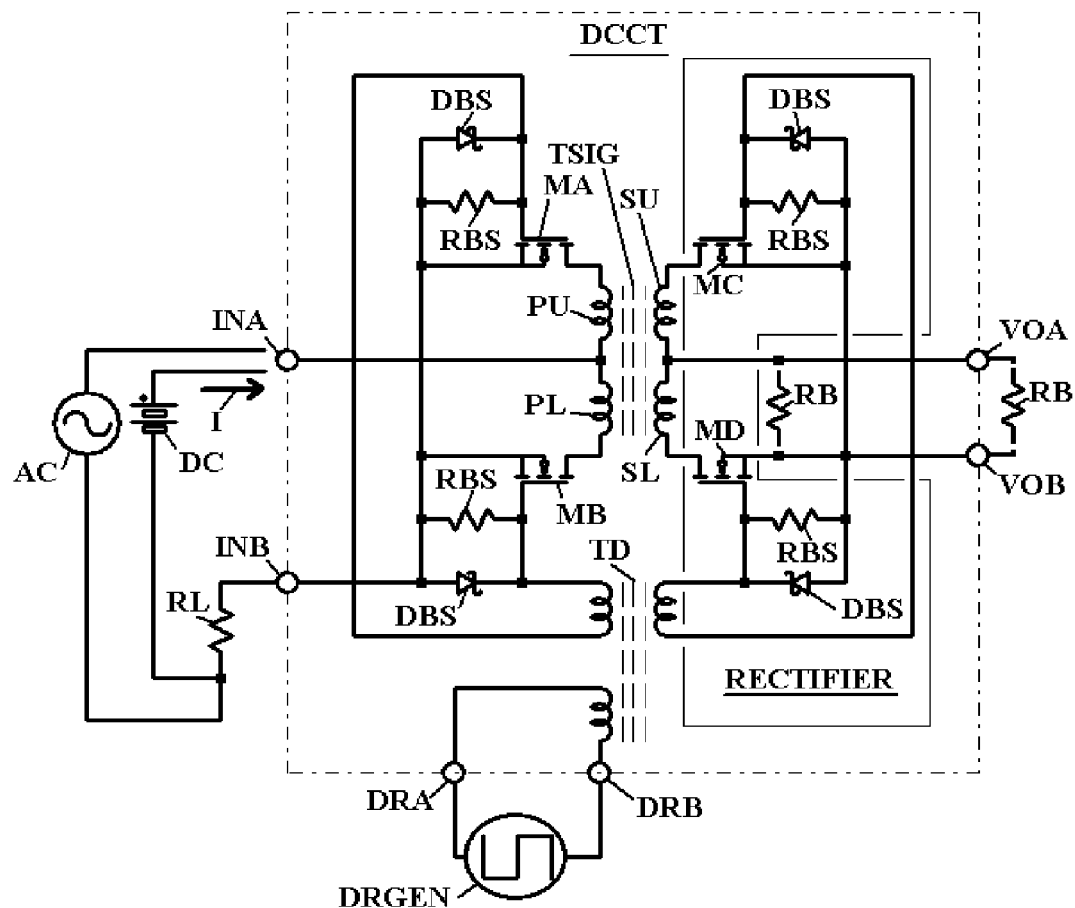

DIRECT-CURRENT CURRENT TRANSFORMER

RELATED U.S. APPLICATION DATA

Provisional Application No. 61/403,297, filed on Sep. 13, 2010.

STATEMENT REGARDING FEDERALLY SPONSORED RESEARCH OR DEVELOPMENT

This invention has been funded solely by the inventor without any federal funds.

BACKGROUND OF THE INVENTION

The AC current transformer has been well-known for many decades, and is used where substantially alternating currents are to be measured. Current transformers are often used when galvanic isolation is required between the circuit being measured and apparatus responsive to current in the measured circuit. However, when direct current flows in the circuit being measured, the AC current transformer is, by itself, unable to transform any DC portion of its input current to responsive apparatus. Moreover, if sufficient direct current flows in a current transformer, core saturation is likely, preventing transformation of either alternating or direct current.

The measurement of DC currents without galvanic isolation is well-known, and is not relevant to this invention. This invention is one form of a type of apparatus known as direct-current current transformers, or DCCT's. Many prior art DCCT's supplement an AC current transformer to provide DC response. One common method is exemplified by the AC/DC current probe of U.S. Pat. No. 7,309,980, wherein a Hall-effect transducer provides low frequency transformation. Such devices have proven useful, but are subject to thermal drift, and to stray magnetic fields and, may require de-gaussing. Another method is alternately to saturate and de-saturate a current transformer core to convert the DC flux therein into a transformable AC signal. This method is exemplified by the current probe of U.S. Pat. No. 6,885,183, which also exemplifies another much-used method, to wit, that of using a DC feedback winding to cancel the DC flux in the transformer core. Generally, the methods using DC feedback are either complex or have bandwidth limited to a few KHz. Numerous other methods, some very complex, have been employed to provide a direct-current current transformer, or DCCT.

OBJECTS OF THE PRESENT INVENTION

A first object of the present invention is to provide current-transformer apparatus capable of transforming both alternating and direct input currents, or a mixture of both, to output a signal responsive thereto. A further object of this invention is to provide such apparatus that is simple, and which provides bandwidth to several MHz. Yet another object of the present invention is to provide a DCCT that is substantially insensitive to stray magnetic fields and, which does not require degaussing.

BRIEF SUMMARY OF THE PRESENT INVENTION

According to this invention, an input current passing through a primary winding of a current transformer is commutated by a first switch to generate AC primary flux in the transformer at a chopping frequency. This flux cuts a secondary winding of the current transformer which is in circuit with a well-known current transformer burden, or load. As occurs with well-known current transformers with well-chosen burdens, magnetic flux of the primary winding is substantially canceled by that of the secondary winding, producing little net flux in the transformer core and little voltage across the burden. The burden of this invention may be a simple resistor, or may comprise other apparatus such as a well known low input-impedance amplifier.

According to this invention, a second switch may be interposed in circuit with the secondary winding and with the burden to commutate its current into the burden, thereby restoring to the burden current any low-frequency or DC components representing low frequency or DC components of the current flowing through the input terminals.

Other well-known means of rectifying the output of the burden may be applied to practice this invention.

The output of this DCCT may be taken as either a voltage, as a current, or as an optical signal to practice this invention.

BRIEF DESCRIPTION OF THE DRAWING

FIG. 1 is a schematic diagram of a preferred embodiment of the present invention.

DETAILED DESCRIPTION OF THE DRAWING

FIG. 1 is a schematic diagram of a preferred embodiment of the present invention. A current I, in this case generated by an AC voltage source AC, or a DC voltage source DC, flows through input terminals INA and INB of DC current transformer, DCCT, and through a load RL, in circuit with both the aforesaid voltage source and input terminals. A first switch comprising MOSFET's MA and MB, steers the input terminal current through either an upper, PU, or a lower, PL, winding of a current transformer TSIG responsive to the state of a chopping signal from a drive generator DRGEN. The chopping signal is applied to DCCT through drive terminals DRA and DRB. In circuit with terminals DRA and DRB is the primary winding of a drive transformer TD, a secondary windings of which provides both galvanic isolation and bipolar drive to the first switch comprising MOSFET's MA and MB. Resistors RBS assure that MOSFET's MA and MB remain in an OFF state unless driven ON by generator DRGEN. Diodes DBS limit negative voltage excursions of the gates of MOSFET's MA and MB relative to their sources, and assure that the drive signal is maximally applied to the gate of the MOSFET being enhanced. In this embodiment, a well-known center-tapped winding and two MOSFET's are arranged in push-pull to commutate input current into transformer TSIG. Obviously, four MOSFET's forming a well-known bridge can be connected in circuit with a non-center-tapped winding to obtain commutation according to this invention. Even with a DC input, the flux in the core of transformer TSIG is AC, responsive to the AC drive from generator DRGEN. The DRGEN signal, is preferably a 100 KHz square wave derived from a digital divider to assure substantially 50% duty cycle, avoiding significant DC flux in the core of transformer TSIG. Since MOSFET's MA and MB of this embodiment are enhancement devices, there exist minuscule times during chopping cycle transitions when both MOSFET's are OFF. This time is adequate to allow short voltage transients to occur which reset any flux in the core of transformer TSIG. To reduce stray inductance, MOSFET's MA and MB may be "DIRECT-FET"s such as International Rectifier type IRF6711. Gate drives of +5V produce good enhancement, with larger voltages achieving minimum voltage between input terminals INA and INB, at the expense of increased switching noise in the inventive DCCT.

In this embodiment, transformer TSIG is wound on a toroidal ferrite core, Magnetics Inc. type J40603, with a center-tapped primary winding of two single turns, and a center-tapped secondary winding of 10 turns, bifilar-wound.

Moving across current transformer TSIG to its secondary side we find a circuit comprising two MOSFET's MC and MD in circuit with upper, SU, and lower, SL, secondary windings, and with a burden resistor RB. Two more resistors RBS, two more diodes DBS, and another secondary winding of drive transformer TD operate analogously to their counterparts on the primary side of transformer TSIG to toggle MOSFET's MC and MD responsive to the AC drive from generator DRGEN, commutating in synchrony with the commutation occurring in the primary circuit thereof the secondary current of transformer TSIG. However, instead of flowing through external terminals commutated TSIG secondary current flows largely through a burden resistor RB, which preferably has a value of 100 milli-ohms.

As occurs in a well-known AC current transformer, the ampere-turns of transformer TSIG primary and secondary windings cancel. Since transformer TSIG secondary windings SU and SL have ten times as many turns as its primary windings PU and PL, their currents must be 1/10th of the input current. As in an ordinary AC current transformer, the output of DCCT, the voltage across the burden, is proportional to input current. As with an ordinary current transformer, the 100 milli-ohms of RB is reflected in the primary circuit as an imaginary 1 milli-ohm shunt resistor in the primary circuit. The turns-ratio of TSIG amplifies the output of that imaginary shunt resistor by 10, yielding 100 mV for 10 amperes of primary current, as in an ordinary AC current transformer. The salient difference between this embodiment of the present invention and an ordinary AC current transformer is that, because of the interposed commutating switch, the inventive DCCT input current can be DC, producing a substantially DC output across burden resistor RB, to be presented at DCCT output terminals VOA and VOB.

Since the currents in MC and MD are smaller than in their counterparts in MA and MB, electrically smaller MOSFET's such as Fairchild Semiconductor type NDS355AN suffice for them.

It should be understood that with a correctly chosen burden RB and well chosen MOSFET's, the voltages occurring between MOSFET drains and sources are, in this embodiment of the present invention, significantly less than one silicon PN diode-drop of about 600 mV.

It is commonly understood that because of the connection of their body diodes to their source terminals, most MOSFET's unilaterally block current flow. What is less widely understood, however, is that below one diode-drop the same MOSFET's bilaterally block in their OFF state. Thus, in this embodiment with its low drain to source voltages, such usually unipolar blocking MOSFET's suffice for bipolar operation, that is operation with both DC and AC inputs and outputs.

It should be understood that either N-channel MOSFET's, P-channel MOSFET's, or combinations of both may be applied to practice this invention, as may NPN and PNP BJT's, or combinations of the above.

It should also be understood that the burden resistor, RB of this embodiment is but a convenient component with which to practice this invention. Well-known circuits having low input impedance and providing a current-responsive output may replace burden resistor RB to practice this invention. This invention may also be practiced by placing burden resistor RB directly in circuit with a secondary winding of transformer TSIG, and converting the resulting AC voltage across burden resistor RB to DC using well-known precision rectifier circuits, synchronous or asynchronous, to replace the commutation at the secondary winding of transformer TSIG. This invention may be practiced by omitting any rectification or commutation of transformer TSIG secondary current and taking an AC output.

It should, moreover, be understood that this invention can be practiced using a burden driving well-known analog to digital conversion (ADC) circuitry having a digital output which may be communicated to other apparatus either through output terminals, or through a well-known optoelectronic link without electrically conductive terminals. The use of digital signal processing to rectify an ADC output is well-known, providing yet another way to rectify the burden output of this invention within the scope thereof.

What is claimed is:

1. A Direct-Current Current Transformer (DCCT) comprising: A single current transformer for transforming an input current to be measured to a current representing the input current, the single current transformer having, A primary winding, A secondary winding and, A single core, A chopping frequency signal and, input terminals for passing the input current through the primary winding of the single current transformer, a commutating switch, in circuit with the input terminals and the single current transformer primary winding responsive to the chopping frequency signal and, either a burden in circuit with the secondary winding of the single current transformer through which flows secondary winding current representing the input current to produce a voltage representing the input current, and output terminals for representing as an output the voltage representing the input current or output terminals for connecting output current representing the input current to a burden or a low input impedance circuit for providing the output signal representing the input current; wherein the (DCCT) transforms both alternating and direct input currents, or a mixture of both, to provide a signal representing the input current.

2. The DCCT of claim 1 wherein the commutating switch comprises MOSFET's.

3. The DCCT of claim 1 wherein the commutating switch comprises BJT's.

4. The DCCT of claim 1 wherein the commutating switch comprises two switches acting in push-pull.

5. The DCCT of claim 1, further comprising a commutating switch in circuit with the current transformer secondary winding.

6. The DCCT of claim 1, further comprising a burden to load the secondary winding of the current transformer.

7. The DCCT of claim 6, wherein the burden is a resistor.

8. The DCCT of claim 6, further comprising a rectifier.

9. A method for transforming both alternating and direct input currents, or a mixture of both, to provide a signal representing the input current, the method comprising:

Passing the input current through input terminals and through a primary winding of a single current transformer for transforming the input current to a current representing the input current, the single current transformer having a single core, and interposing a commutating switch responsive to a chopping frequency signal in circuit with the input terminals and the primary winding of the single current transformer to avoid DC flux in the single core of the single current transformer, thus preventing saturation of the single core by low frequency or direct input current passing through the primary winding of the single current transformer and, either connecting the current representing the input current to a burden to produce a signal representing the input current, or passing the current representing the input current through output terminals to a burden to produce a signal representing the input current.

* * * * *